United States Patent [19]

Iyer et al.

[11] Patent Number: 4,617,087
[45] Date of Patent: Oct. 14, 1986

[54] METHOD FOR DIFFERENTIAL SELECTIVE DEPOSITION OF METAL FOR FABRICATING METAL CONTACTS IN INTEGRATED SEMICONDUCTOR CIRCUITS

[75] Inventors: Subramanian S. Iyer; Rajiv V. Joshi, both of Yorktown Heights, N.Y.

[73] Assignee: International Business Machines Corporation, Armonk, N.Y.

[21] Appl. No.: 780,871

[22] Filed: Sep. 27, 1985

[51] Int. Cl.$^4$ .......................... C23F 1/02; B44C 1/22; C03C 15/00; C03C 25/06
[52] U.S. Cl. .......................... 156/643; 29/571; 29/591; 134/1; 156/646; 156/656; 156/664; 156/345; 204/192.35; 204/298; 427/88; 427/89; 427/91
[58] Field of Search .................. 134/1; 156/643, 646, 156/656, 664, 345; 427/88, 89, 91; 357/65, 67, 71; 204/164, 192 EC, 192 E, 298; 29/571, 591

[56] References Cited

U.S. PATENT DOCUMENTS 3,785,862  1/1974  Grill .................................. 117/217
4,349,408  9/1982  Tang et al. ........................ 156/628

Primary Examiner—William A. Powell
Attorney, Agent, or Firm—John J. Goodwin

[57] ABSTRACT

A deposition technique for forming metal regions on semiconductor substrates, and more particularly to a fabrication method for the differential selective deposition of tungsten for forming tungsten contacts on an integrated circuit chip.

Tungsten hexafluoride gas (WF6) is introduced into a deposition chamber containing a silicon substrate with an apertured silicon dioxide mask layer thereon. The exposed Si surfaces on which the selective deposition is to be performed, are first converted to W surfaces by the substitution reaction:

$$2WF_6 + 3Si = 2W + 3SiF_4$$

After the surface has been substituted, the WF$_6$ is mixed with H$_2$ as to give deposition of W by partially preferential nucleation on the already converted W surfaces. Then NF$_3$ is bled into the system and a plasma is struck in the reaction chamber to create a simultaneous etching condition for the tungsten.

The amount of NF3 and the plasma power coupled into the chamber are such as to ensure that the SiO$_2$ surface is kept clean at all times. Thus any nuclei that may be formed on the SiO$_2$ surface, are immediately cleaned out. Since the deposition rate on the exposed W surfaces is much higher than on the SiO$_2$ surfaces, there will be net deposition on these areas in spite of the etching action, albeit at a lower rate.

5 Claims, 3 Drawing Figures

METHOD FOR DIFFERENTIAL SELECTIVE DEPOSITION OF METAL FOR FABRICATING METAL CONTACTS IN INTEGRATED SEMICONDUCTOR CIRCUITS

BACKGROUND OF THE INVENTION

1. Field of the Invention

The present invention relates to deposition techniques for forming metal regions on semiconductor substrates, and more particularly to a fabrication method for the differential selective deposition of tungsten for forming tungsten contacts on an integrated circuit chip.

2. Description of the Prior Art

In prior art techniques for selective deposition of tungsten contact metal in a via for subsequent planarizing, a substitution reaction is used where W from $WF_6$ gas substitutes for Si in exposed silicon areas to produce a thin W surface. Hydrogen is then introduced into the CVD reactor and tungsten is deposited by reaction with the $WF_6$ source gas.

In the present invention disclosure, this technique is improved in that $NF_3$ is then bled into the system and a plasma is struck in the reaction chamber. This produces an etching condition such that the $SiO_2$ surface is kept clean. U.S. Pat. No. 3,785,862, issued Jan. 15, 1974 to Grill relates to a process for depositing tungsten on a substrate which comprises silicon dioxide. The process comprises the steps of heating the silicon dioxide layer in an enclosed chamber. An inert gas, such as nitrogen, and a reducing gas, such as hydrogen, are introduced into the chamber. The silicon dioxide layer is then treated with tungsten hexafluoride for a brief period, in order to etch the silicon dioxide layer and deposit a relatively thin layer of tungsten thereon. The chamber is then purged of all the unreacted hexafluoride. The inert gas flow is discontinued, and additional reducing gas and newly vaporized hexafluoride are mixed in the chamber to reduce the hexafluoride and deposit a relatively thick layer of the metal constituent thereof on the thin layer.

Treatment of the silicon oxide surface with the hexafluoride etches the oxide layer, modifying its properties such that a refractory metal layer adheres much better than without such treatment; additionally, the simultaneous reduction of a small amount of the hexafluoride controls the etching attack during the etching step, which protects the silicon dioxide over the PN junctions from further etching.

U.S. Pat. No. 4,349,408, issued Sept. 14, 1982 to Tarng et al relates to a method of depositing a refractory metal (tungsten) on a semiconductor substrate wherein a passivation material is also deposited around the periphery of the metal.

This is accomplished by depositing an oxygen doped polycrystalline silicon layer on one surface of the semiconductor substrate and then depositing a phosphorus doped polycrystalline silicon layer on the outermost surface of the first layer. Thereafter, windows are etched in the layers to expose surface areas of the substrate where the metal is to be deposited. Afterwards, the tungsten contact is deposited on the exposed surface areas of the substrate by CVD techniques.

In accordance with a CVD technique, tungsten (W) is deposited on the surface areas by placing the substrate in a CVD reactor and heating the substrate. Tungsten hexafluoride ($WF_6$) and an inert carrier gas such as argon (Ar) or nitrogen ($N_2$) are then fed into the reactor and the tungsten hexafluoride will react with the silicon in accordance with the following:

$$2WF_6 + 3Si \rightarrow 2W \downarrow + 3SiF_4 \uparrow$$

The deposition of tungsten will stop after a layer of from about 500 angstroms to about 2,000 angstroms thick has been deposited. Inasmuch as a layer of about 4,000 angstroms thick is desired, the deposition process must be altered. In order to deposit the additional 2,000 angstroms to 3,500 angstroms of tungsten, the temperature is lowered. At this point, hydrogen ($H_2$) is added to the tungsten hexafluoride and carrier gas. The tungsten hexafluoride will react with the hydrogen to deposit the desired additional tungsten in accordance with the following:

$$WF_6 + 3H_2 \rightarrow W \downarrow + 6HF \uparrow$$

SUMMARY OF THE INVENTION

An object of the present invention is to provide an improved method for forming tungsten contacts on an integrated circuit chip.

Another object of the present invention is to provide a method for the differential, selective deposition of tungsten.

A further object of the present invention is to provide an improved method for fabricating a metal planarizing stud in an integrated circuit contact hole.

Still another object of the present invention is to provide an improved method for the differential selective deposition of tungsten wherein $NF_3$ is introduced into the deposition process and a plasma is formed to create a simultaneous etching condition for tungsten.

The foregoing and other objects, features and advantages of the invention will be apparent from the following more particular description of the invention as illustrated in the accompanying drawings.

DESCRIPTION OF THE INVENTION

Figure 1:
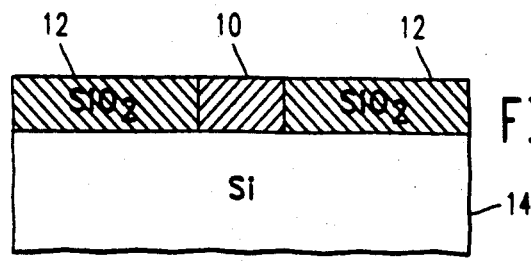
FIG. 1 is a schematic illustration of a cross-section of an integrated circuit chip showing a planarizing metal stud in a contact hole as used in the present invention.

Contact as well as inter level vias on a Very Large Scale Integrated Circuit (VLSI) chip present a serious concern from the metal coverage point of view. The severe topography results in poor step coverage and this results in problems such as electromigration, etc. These problems may be minimized by the use of a metal planarizing stud in the via as shown in FIG. 1 wherein a metal stud 10 is provided in a contact hole (via) in the insulation layer 12 on the semiconductor substrate 14.

However, selective deposition of metal in the via alone and planarizing this structure is a very complex process. Selective chemical vapor deposition (CVD) of tungsten techniques have been employed. In these techniques, use is made of a substitution reaction, where tungsten W from the tungsten hexafluoride $WF_6$ source gas, substitutes for silicon Si in the exposed silicon areas.

$$2WF_6 + 3Si = 2W + 3SiF_4$$

This is a truly selective reaction but has the limitation that it is self-limiting. After the surface (perhaps a few 100 angstroms) is converted to W, no further substitution takes place. At this point, hydrogen is bled into the CVD reactor. Now tungsten is deposited by the net reaction $$WF6 + 3H2 = W + 6HF$$

In this part of the process, W is deposited by a nucleation type of process. In such process, unless extremely clean $SiO_2$ surfaces exist, it is impossible in the above reaction to avoid nucleation centers on the $SiO_2$ and to thus preferentially deposit W only on the W surfaces created by the initial part of the process. There are serious practical problems with this technique. It has been found that it is very difficult to maintain a clean $SiO_2$ surface and that selective deposition is not possible in a reproducible and reliable manner. Further is has been found that selectivity is lost whenever thick films of W (>100 nm) are to be deposited.

Figure 2:
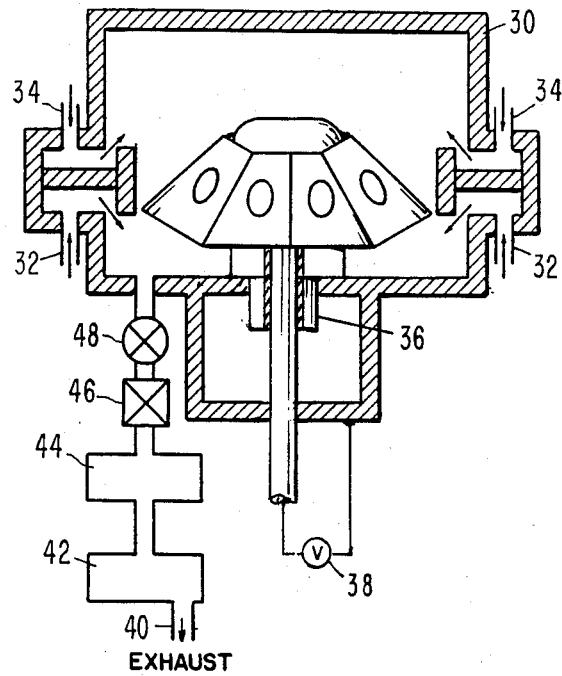
FIG. 2 is a schematic drawing which illustrates a typical apparatus used in the method of the present invention.

To overcome the above difficulties the present invention provides an improved technique to achieve selective deposition. The structure to carry out the process is shown in schematic form in FIG. 2. The deposition process chamber 30 contains the specimens. Tungsten hexafluoride gas is introduced into chamber 30 through ports 34. A hydrogen-helium combination is introduced into chamber 30 through ports 34. Excitation is provided by the r.f. generator 38 and an infrared sensor lamp assembly 36 is provided. A high vacuum valve 48, a throttle valve 46, a blower 44 and pump 42 are provided to exhaust chamber 30 through port 40. The initial portion of the process remains similar to the prior art steps described previously. The exposed Si surfaces on which the selective deposition is to be performed, are first converted to W surfaces by the substitution reaction:

$$2WF_6 + 3Si = 2W + 3SiF_4$$

After the surface has been substituted, the second part of the process is initiated. This involves three parameters. Frrst, the $WF_6$ is mixed with $H_2$ as before to give deposition of W by partially preferential nucleation on the already converted W surfaces. Then $NF_3$ is bled into the system and a plasma is struck in the reaction chamber. The effect of the latter two actions is to create a simultaneous etching condition for the tungsten.

$$NF3 \xrightarrow[F + W]{Plasma} F + \text{other products}$$
$$\longrightarrow WF6$$

(here charge balance has been neglected).

The amount of NF3 and the plasma power coupled into the chamber are such as to ensure that the $SiO_2$ surface is kept clean at all times. Thus any nuclei that may be formed on the $SiO_2$ surface, are immediately cleaned out. Since the deposition rate on the exposed W surfaces is much higher than on the $SiO_2$ surfaces, there will be net deposition on these areas in spite of the etching action, albeit at a lower rate. The important advantage is that selectivity is maintained even for thick W films. Also, the deposition rate in the second part of the process is actually increased due to the plasma.

Figure 3:
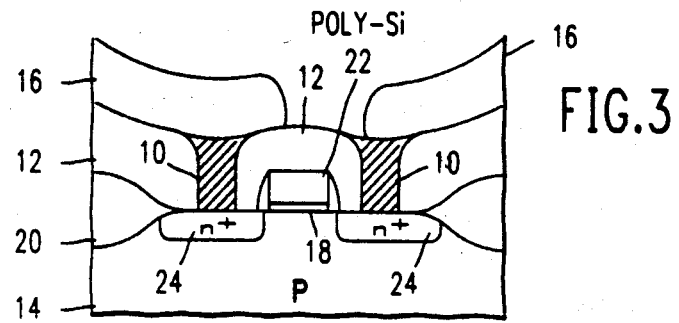
FIG. 3 is a schematic drawing showing the cross-section of the integrated circuit chip including the deposition of the tungsten using the method of the present invention.

The resultant contact structure is shown in the schematic illustration of FIG. 3. The metal contacts 10, formed of metal studs in the via holes in the silicon dioxide layer 12 in accordance with the present process, interconnect aluminum layers 16 and the n+ regions 24. The recessed oxide isolation regions 20 and the polysilicon gate 22 with its gate oxide 18 form the rest of the integrated circuit.

Thus, a differential deposition technique, which takes a reaction that is quasi selective and combines it with an in-situ etching process to yield a truly selective W deposition process that is capable of very thick selectively deposited films has been provided.

Having thus described our invention, what we claim as new, and desire to secure by Letters Patent is:

1. A method for the selective deposition of a metal onto a silicon substrate, having an apertured silicon dioxide mask layer thereon and located in a deposition chamber comprising the steps of:

the step of introducing a metal source gas into said chamber for reaction with said silicon substrate wherein said metal from said source gas substitutes for said silicon on said substrate surface to form a deposited metal layer in said apertures in said silicon dioxide layer on said silicon substrate, the step of introducing hydrogen into said chamber with said metal source gas wherein said hydrogen reacts with said metal source gas to form a further deposition of said metal on said substrate surfaces including said previously deposited layer and said silicon dioxide layer, the step of introducing an etching gas into said chamber and activating the etching gas in said chamber for etching said metal being further deposited, said further deposition of said metal onto said previously coated metal layer surfaces being at a greater rate than said deposition onto said silicon dioxide layer surfaces such that said etching process selectively maintains said silicon surfaces free of metal while further metal deposition occurs on said previously coated metal layer surfaces.

2. A method according to claim 1 wherein said metal deposited on said substrate is tungsten and said source gas is tungsten hexafluoride which reacts with said silicon substrate to form said deposited tungsten on said silicon and silicon tetrafluoride gas.

3. A method according to claim 2 wherein said hydrogen introduced into said tungsten hexafluoride source gas reacts therewith to form said further deposited tungsten on said previously deposited tungsten and said silicon dioxide layer.

4. A method according to claim 3 wherein said further tungsten deposits on said previously deposited tungsten at a faster rate. Then it deposits on said silicon dioxide layer, such that said etching gas etches said silicon dioxide layer free of said further deposited tungsten while said further deposited tungsten continues to form on said previously deposited tungsten.

5. A method according to claim 2 wherein said etching gas is nitrogen trifluoride which etches unintentionally deposited tungsten to form volatile products.

* * * * *